(12) United States Patent
Deutschle et al.

(10) Patent No.: US 8,117,574 B2
(45) Date of Patent: Feb. 14, 2012

(54) IMPLEMENTING A SERIALIZATION CONSTRUCT WITHIN AN ENVIRONMENT OF PARALLEL DATA FLOW GRAPHS

(75) Inventors: Joerg Deutschle, Winnenden (DE); Harald Gerst, Boeblingen (DE); Joerg Walter, Tueblingen (DE)

(73) Assignee: International Business Machines Corporation, Armonk, NY (US)

( * ) Notice: Subject to any disclaimer, the term of this patent is extended or adjusted under 35 U.S.C. 154(b) by 521 days.

(21) Appl. No.: 12/330,890

(22) Filed: Dec. 9, 2008

(65) Prior Publication Data
US 2009/0172484 A1    Jul. 2, 2009

(30) Foreign Application Priority Data
Jan. 2, 2008   (EP) .................................. 08100016

(51) Int. Cl.
*G06F 9/455* (2006.01)
*G06F 17/50* (2006.01)

(52) U.S. Cl. ........................................ 716/106; 716/101
(58) Field of Classification Search ................... 716/106
See application file for complete search history.

(56) References Cited

U.S. PATENT DOCUMENTS

| 5,530,841 A * | 6/1996 | Gregory et al. ............... 716/103 |
| 2006/0195732 A1 | 8/2006 | Deutschle et al. |

\* cited by examiner

*Primary Examiner* — Nghia Doan
*Assistant Examiner* — Eric Lee
(74) *Attorney, Agent, or Firm* — Dennis Jung, Esq.; Blanche E. Schiller, Esq.; Heslin Rothenberg, Farley & Mesiti P.C.

(57) ABSTRACT

A serialization construct is implemented within an environment of a number of parallel data flow graphs. A quiesce node is appended to every active data flow graph. The quiesce node prevents a token from passing to a next data flow graph within a chain before an execution of the active data flow graph has been finished. A serial data flow graph is implemented to provided for a serial execution while no other data flow graph is active. A serialize node is appended to a starting point of a serial data flow graph. A serialize end node is appended to an endpoint of the serial data flow graph. The serialize node is activated to start a serial operation. The serialize end node is activated after the serial operation has been terminated.

17 Claims, 4 Drawing Sheets

| 10 | DATA FLOW GRAPH |
| 12 | DATA FLOW GRAPH |
| 14 | DATA FLOW GRAPH |
| 16 | NODE OBJECT |
| 18 | SERIALIZE NODE OBJECT |
| 20 | QUIESCE MANAGER |
| 22 | QUIESCE NODE OBJECT |
| 24 | SERIALIZE END NODE OBJECT |

IMPLEMENTING A SERIALIZATION CONSTRUCT WITHIN AN ENVIRONMENT OF PARALLEL DATA FLOW GRAPHS

BACKGROUND

1. Field of the Invention

The present invention relates to a method for implementing a serialization construct within an environment of parallel data flow graphs.

2. Description of the Related Art

Data flow graphs are used to implement operations taking place in order to verify the correct functional behavior of a logic design for an electronic circuit. An example is a main memory read operation in a computer system, wherein a data flow graph implementation consists of a node and an address. Said node controls signals of the logic design. The address is applied to the main memory while a following node receives and checks the data provided by the main memory.

A test generator which is used in the logic design verification can continuously generate data flow graphs with different operations. The data flow graphs can be chained together, so that a data flow graph chain represents a sequence of randomly selected operations. An environment of parallel data flow graphs allows the parallel execution of the data flow graphs. Thus, multiple data flow graph chains are usually running in parallel.

The patent application US 2006/0195732 A1, incorporated herein by reference, describes an integrated verification framework for concurrent execution of random and deterministic test cases. This is a data flow architecture, wherein random and deterministic test sequences are modeled into data flow graphs and executed in parallel. The verification framework does not contain a way to serialize the execution into a single test sequence. All active data flow graphs are executed independent of each other.

Such a serialization is required for some applications. For example, for the verification of an address translation unit in a processor design where such a framework is used, a serial construct is required. In the known IBM System z mainframe computing system, such serial construct is needed because changes to an address mapping table used for the dynamic address translation from virtual to real addresses must be done by one processor only. In this case all other processors using the same translation space must be stopped until an address mapping table update is completed.

In the environment described above, the only way to achieve this behavior is to signal a quiesce request to all test case generators in the environment in order to prevent a generation of new test sequences until the quiesce operation is finished. The drawback of this approach is that its implementation is specific for this application. But the number and type of test case generators depend on the device under verification. Its implementation breaks the data flow concept of the underlying framework.

It is therefore an object of the present invention to provide an improved method for implementing a serialization construct within an environment of parallel data flow graphs.

BRIEF SUMMARY

The above object is achieved by a method as laid out in the independent claims. Further advantageous embodiments of the present invention are described in the dependent claims and are taught in the description below.

The advantages of the invention are achieved by providing a set of special administrative nodes. Unlike regular nodes within the framework of the data flow graph, said administrative nodes do not interact with a device under test or another device connected to the framework. The administrative nodes are multiple quiesce nodes, a serialize node and a serialize end node. The multiple quiesce nodes, the serialize node and the serialize end node are provided to temporarily cache the tokens from the data flow graph to the next data flow graph.

The administrative nodes may be controlled by at least one quiesce manager. If a serial operation or a serial sequence of operations is required, then the quiesce nodes are appended to every active data flow graph by the quiesce manager. The serial operation or the sequence of serial operations is started by a serialize node and terminated by a serialize end node. In this context, the term "serial data flow graph" is referring to a data flow graph which is executed while all other data flow graphs are inactive. The invention describes a mechanism to restrict the parallel execution of data flow graphs to a single data flow graph. After execution of the single or serial data flow graph, parallel execution is resumed. The parallelism inside the serial data flow graph is not restricted, but it may have any structure possible. In other words, the parallelism is allowed within the serial data flow graph.

The quiesce nodes have a callback function implemented in order to call the serialize node. The serialize node is required in the beginning of the serial operation or the sequence in order to run without any other test activity.

Whenever an active data flow graph ends, then the quiesce node is activated. The callback to the quiesce manager flags the termination of the corresponding data flow graph. When all active data flow graphs are finished, then the quiesce manager activates the serialize node, which fires and triggers the first operating node of the serial sequence.

During the execution of the serial sequence all quiesce nodes are still active. After the serial operation or the serial sequence of operations has been finished, the regular parallel execution can be resumed. This allows the test case generators to be continuously active. The test case generators can append new test sequences to the existing data flow graphs. However, these new sequences are not activated before the serial sequence has been finished. Thus, there is no interaction with the test case generators required. The inventive method works completely within the framework of the data flow graph. Due to the automatic insertion of quiesce nodes, the overhead to implement a serial sequence is negligible.

BRIEF DESCRIPTION OF THE SEVERAL VIEWS OF THE DRAWINGS

The above features and advantages of the present invention, as well as the additional objectives, will be apparent in the following detailed written description.

The novel and inventive features believed characteristic of the invention are set forth in the appended claims. The invention itself, their preferred embodiments and advantages thereof will be best understood by reference to the following detailed description of the preferred embodiments in conjunction with the accompanied drawings, wherein:

DETAILED DESCRIPTION

The preferred embodiment is an extension of the test environment described in US 2006/0195732 A1. In this data flow graph framework, the data flow graphs are implemented as objects, which are instances of C++ classes. The nodes of a data flow graph are also implemented as objects, namely instances of a further specific C++ class. The nodes are arranged in a chained list as part of the data flow graph object. Also the data flow graph objects are arranged in form of a chained list. In another embodiment, a different object oriented programming language such as Java can be used instead in order to implement the objects.

Figure 1:
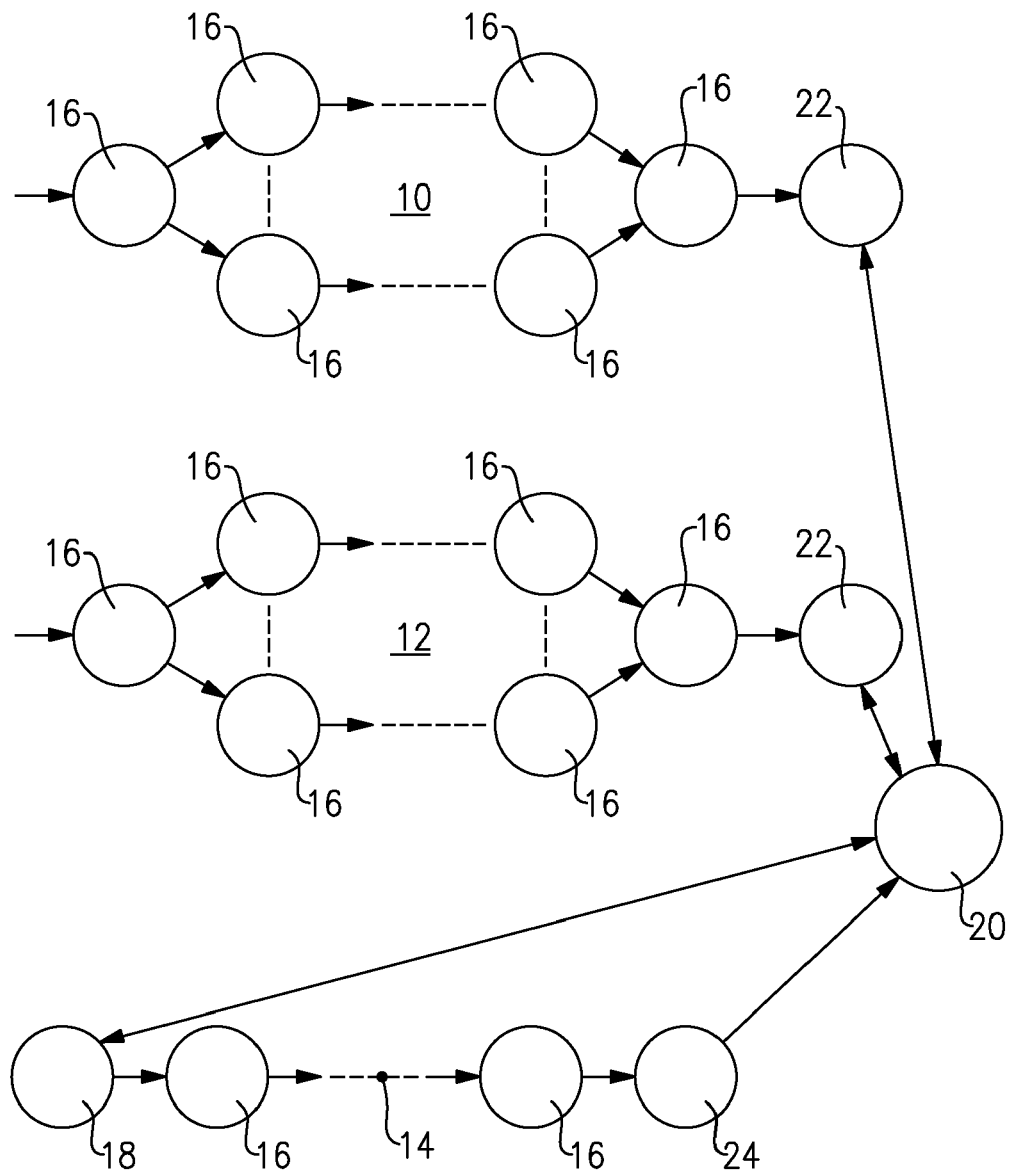
FIG. 1 shows a diagram of an environment with parallel data flow graphs and a serial data flow graph according to the present invention.

FIG. 1 shows a schematic diagram of an environment with parallel data flow graph objects and a serial data flow graph object. In FIG. 1 a first data flow graph object 10, a further data flow graph object 12 and a serial data flow graph object 14 are shown. In general, the first data flow graph object 10 and the further data flow graph 12 object may be comprised of a number of data flow graph objects, for which their interconnection is implemented by means of a chained list of data flow graph objects. An arbitrary number of data flow graph objects 10 and 12 may be active in parallel within the environment. The data flow graph objects 10 and 12 may be generated at the simulation startup time by a test case generator.

Each of the data flow graph objects 10, 12 and 14 comprises a plurality of regular node objects 16. The regular node objects 16 represent instructions or operations for a device under verification. The arcs between the regular nodes 16 of the data flow graphs 10 and 12 describe the structure of the test case. An arc in a data flow graph object is implemented as a pointer from one node object to the next node object in the chained list of node objects. The inputs of the device under verification are stimulated by the test case generators within a verification environment. The information stored in the active regular node objects 16 of the data flow graph objects 10, 12 and 14 is used.

When the test case generator creates a serial sequence, its first node object is a special serialize node object 18. Said serialize node object 18 is registered within a quiesce manager 20, which is an instance of a C++ class. The quiesce manager 20 appends then a quiesce node object 22 to the chained list of node objects of each of the data flow graph objects 10 and 12, which is currently active. Whenever the processing of one of the data flow graph objects 10 and 12 is finished and the quiesce node 22 is activated, a callback function of the data flow graph object calls the quiesce manager 20 in order to set a flag which indicates that the processing of the corresponding data flow graph objects 10 or 12 has been completed. When the processing of all active data flow graph objects 10 and 12 is finished, then the serialize node object 18 is activated by the quiesce manager 20.

The quiesce manager 20 activates a serial sequence by calling a certain entry function of the corresponding data flow graph object. During processing of said serial sequence, all quiesce node objects 22 stay active, so that they prevent the activation of the data flow graph objects 10 and 12 appended to them. In this way, the test case generators may stay active and create test operations at will. These test case operations will be activated only then, if the serial sequence has been finished and a serialize end node object 24 has been activated. The serialize end node object 24 sends to the quiesce manager 20 a message that the serial sequence has been finished. Then the quiesce manager 20 in turn sends said message to every quiesce node object 22, which is currently active. On reception of said message, the quiesce node object 22 terminates and activates the corresponding data flow graph objects 10 or 12, which are connected to it.

The concept of the present invention enhances the existing data flow graph framework while keeping a backward compatibility. There are no modifications necessary to existing test cases or codes. Due to the automatic handling of the quiesce node objects 22 by the quiesce manager 20, the overhead to use the invention is minimal.

Figure 2:
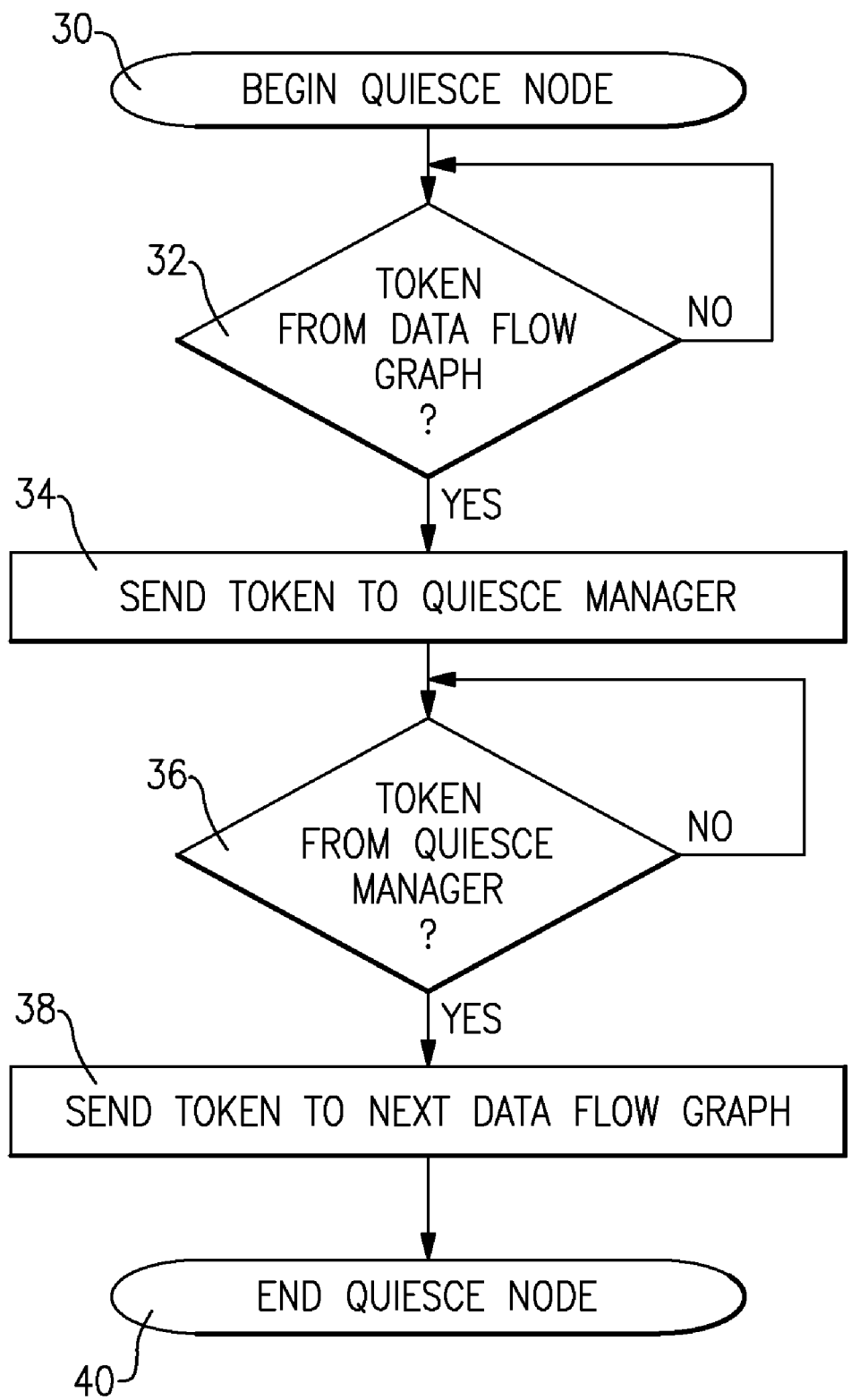
FIG. 2 shows a schematic flow chart diagram illustrating the behavior of a quiesce node according to the present invention.

FIG. 2 shows a schematic flow chart diagram, which illustrates the behavior of the quiesce node object 22. Whenever a serialization operation is required, the quiesce node object 22 is appended to the data flow graph objects 10 and 12, which are currently active.

In a step 30 the quiesce node object 22 begins its processing. In a loop 32 it is determined if a token from the data flow graph object 10 and/or 12 is passed to the quiesce node object 22. The token is sent by the quiesce node object 22 to the quiesce manager 20 in a further step 34, wherein the quiesce node object 22 passes the information about the termination of the previous data flow graph object to the quiesce manager 20.

In a next step 36, it is determined if a token from the quiesce manager 20 has been received. Then the quiesce node object 22 waits until it is signaled by the quiesce manager 20 that the execution may be proceed. Then the quiesce manager 20 sends a token in order to activate the following data flow graph object in a further step 38. In a last step 40 the quiesce node object 22 ends its processing.

Figure 3:
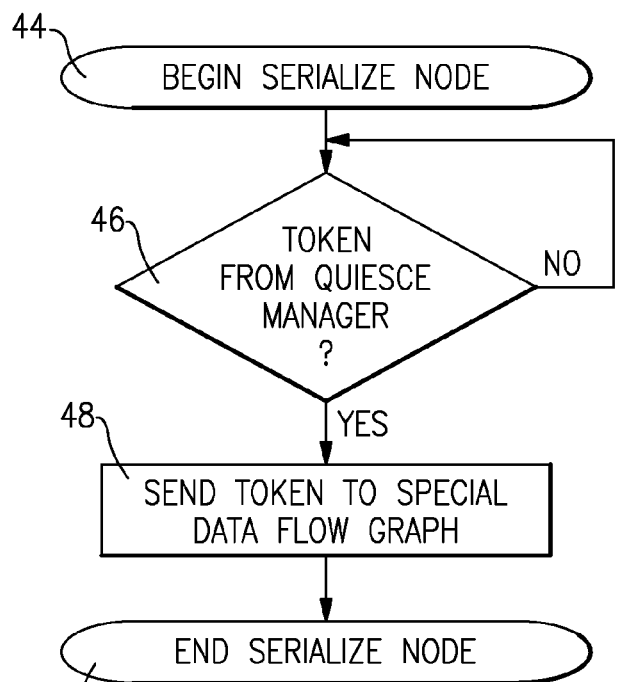
FIG. 3 shows a schematic flow chart diagram illustrating the behavior of a serialize node according to the present invention.

FIG. 3 shows a schematic flow chart diagram, which illustrates the behavior of the serialize node object 18. The serialize node object 18 marks the beginning of the serial data flow graph object 14. The serialize node object 18 receives an activation token from the quiesce manager 20 and passes it onto the serial data flow graph object 14, wherein said serial data flow graph object 14 will be activated.

In step 44, the serialize node object 18 begins its processing. In loop 46, it is determined if a token from the quiesce manager 20 is received. In a next step 48, the token is sent to serial data flow graph object 14. In a last step 50, the serialize node object 18 ends its processing.

Figure 4:
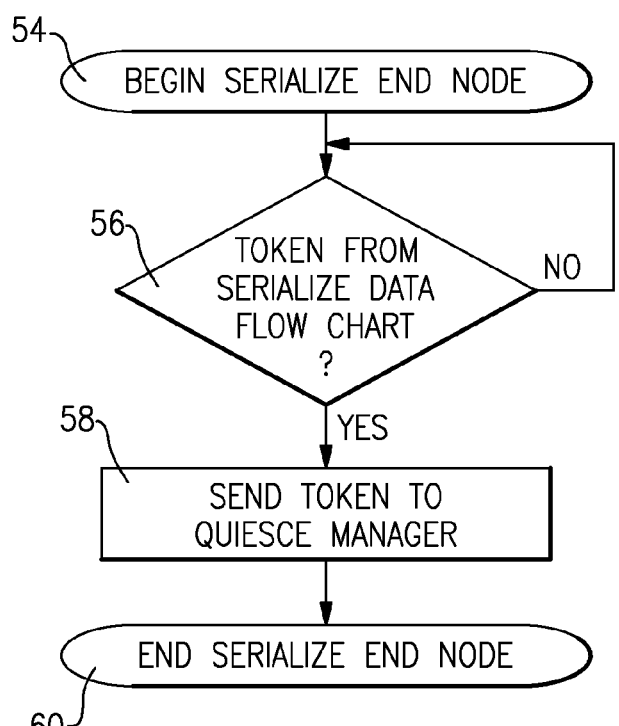
FIG. 4 shows a schematic flow chart diagram illustrating the behavior of a serialize end node according to the present invention.

FIG. 4 shows a schematic flow chart diagram, which illustrates the behavior of the serialize end node object 24. The serialize end node object 24 marks the end of the serial data flow graph object 14. The serialize node object 18 receives its activation token from the serial data flow graph object 14. Then the serialize end node object 24 sends a token back to the quiesce manager 20. Said token indicates the completion of the processing of the serial data flow graph object 14.

In step 54, the serialize end node object 24 begins its processing. In loop 56, it is determined if a token from the serial data flow graph 14 is received. In a next step 58, the token is sent to the quiesce manager 20. In a last step 60, the serialize end node object 24 ends its processing.

Figure 5:
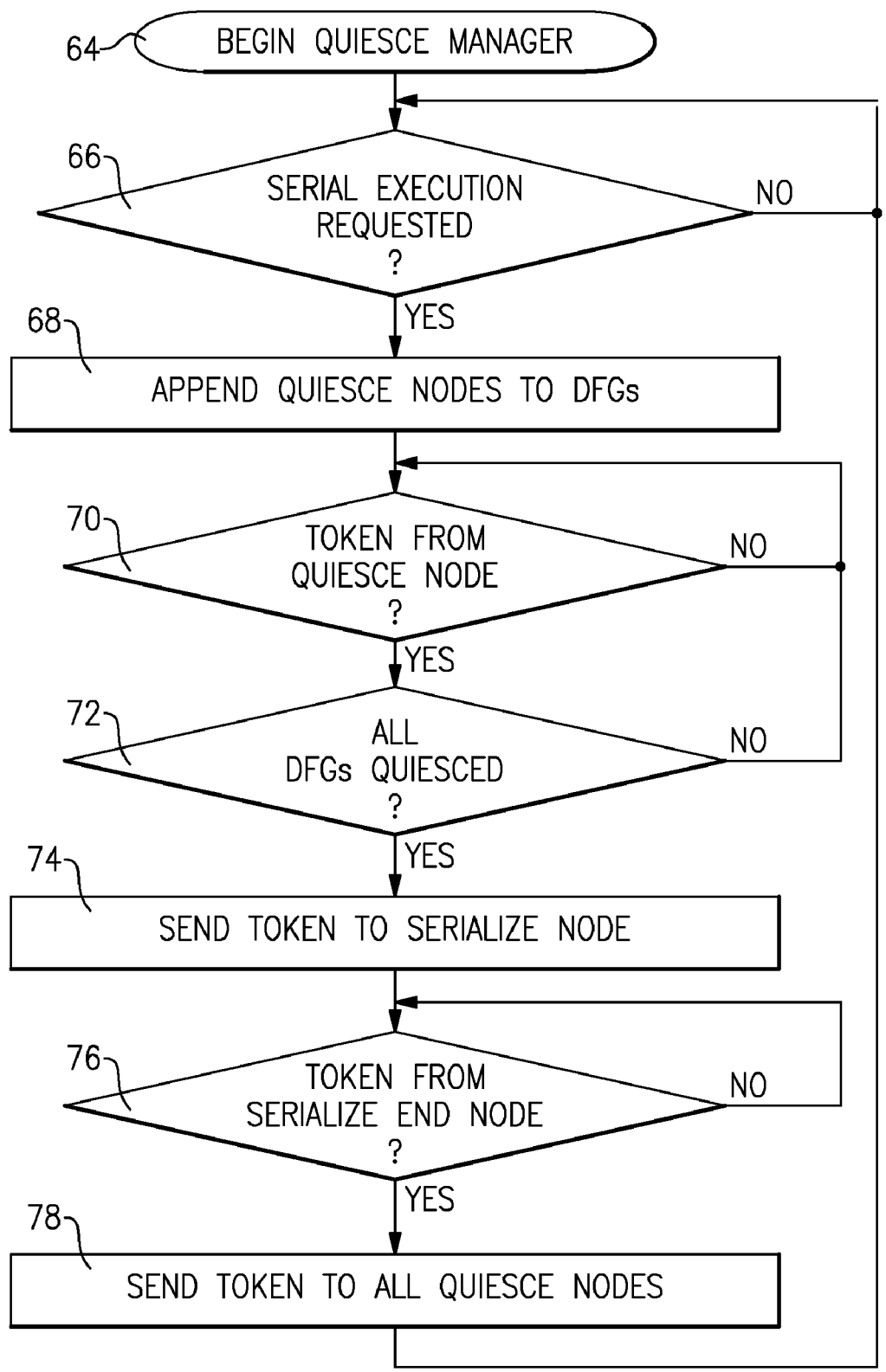
FIG. 5 shows a schematic flow chart diagram illustrating the behavior of a quiesce manager according to the present invention.

FIG. 5 shows a schematic flow chart diagram, which illustrates the behavior of the quiesce manager 20. The quiesce manager 20 keeps track of all the data flow graph objects 10 and 12, which are currently active.

In step 64, the quiesce manager 20 begins its processing. In loop 66, it checks if a serial execution has been requested. If a serialization is required, the quiesce manager 20 appends a quiesce node object 22 to each active data flow graph object 10 and 12 in a next step 68. The quiesce manager 20 also precedes the serial data flow graph object 14 with a serialize node object 18 and appends a serialize end node object 24 to the end of the serial data flow graph object 14.

In a further step 70, it is determined if a token from the quiesce node object 22 has been received. In step 72, it is further determined if all data flow graph objects 10 and 12 have been quiesced. Then the quiesce manager 20 waits for the quiesce nodes 22 of the data flow graph objects 10 and 12. Said quiesce nodes 22 indicate that the previous data flow graph objects 10 and 12 have completed their processing and the data flow graph objects 10 and 12 are quiesced. After all quiesce node objects 22 have sent their token to the quiesce manager 20, the system is quiesced and the serial data flow graph object 14 can be started. Therefore the quiesce manager 20 sends a corresponding token to the serialize node object 18 in a step 74.

In a next step 76, it is determined if a token from the serialize end node object 24 has been received. The quiesce manager 20 receives a token from the serialize end node object 24 after the serial data flow graph object 14 has finished its execution. In a last step 78, the quiesce manager 20 sends tokens to all quiesce node objects 22 in the system. Step 78 indicates that the serialization has been ended and a parallel execution may resume.

The present invention can also be embedded in a computer program product which comprises all the features enabling the implementation of the methods described herein. Further, when loaded in computer system, said computer program product is able to carry out these methods.

Although illustrative embodiments of the present invention have been described herein with reference to the accompanying drawings, it is to be understood that the present invention is not limited to those precise embodiments, and that various other changes and modifications may be affected therein by one skilled in the art without departing from the scope or spirit of the invention. All such changes and modifications are intended to be included within the scope of the invention as defined by the appended claims.

The invention claimed is:

1. A method for implementing a serialization construct within an environment of a number of parallel data flow graphs, which method comprising:
    appending, by a quiesce manager executing on a processor, a quiesce node to an active data flow graph, wherein the quiesce node prevents a token from passing to a next data flow graph within a chain before an execution of the active data flow graph has been finished;
    implementing a serial data flow graph provided for a serial execution while no other data flow graph is active;
    appending a serialize node to a starting point of the serial data flow graph;
    appending a serialize end node to an endpoint of the serial data flow graph, wherein the quiesce manager is connected to the quiesce node, to the serialize node and/or to the serialize end node;
    activating the serialize node to start a serial operation; and
    activating the serialize end node after the serial operation has been terminated.

2. The method according to claim 1, wherein the serial operation comprises a sequence of operations.

3. The method according to claim 1, wherein a parallelism is allowed inside the serial data flow graph.

4. The method according to claim 1, wherein the activation of the serialize end node terminates all currently active quiesce nodes.

5. The method according to claim 1, wherein the activation of the serialize end node allows a token to pass to the next data flow graph within the chain.

6. The method according to claim 1, wherein the quiesce node receives a token from the associated data flow graph and sends the token to the corresponding next data flow graph.

7. The method according to claim 1, wherein the serialize node receives a token from the quiesce manager and sends the token to the serial data flow graph.

8. The method according to claim 1, wherein the serialize end node receives a token from the serial data flow graph and sends the token to the quiesce manager.

9. The method according to claim 1, wherein the quiesce manager receives requests of the serial operation.

10. The method according to claim 1, wherein the quiesce manager receives a token from the quiesce nodes.

11. The method according to claim 10, wherein the quiesce manager sends the token to the serialize node during the serial operation.

12. The method according to claim 10, wherein the quiesce manager sends the token to the serialize node during the serial sequence of operations.

13. The method according to claim 10, wherein the quiesce manager sends the token to all quiesce nodes after the serial operation has finished.

14. The method according to claim 10, wherein the quiesce manager sends the token to all quiesce nodes after the serial sequence of operations has finished.

15. A system for implementing a serialization construct within an environment of a plurality of parallel data flow graphs, wherein the system is provided to perform the method comprising:
    appending, by a quiesce manager executing on a processor, a quiesce node to an active data flow graph, wherein the quiesce node prevents a token from passing to a next data flow graph within a chain before an execution of the active data flow graph has been finished;
    implementing a serial data flow graph provided for a serial execution while no other data flow graph is active;
    appending a serialize node to a starting point of the serial data flow graph;
    appending a serialize end node to an endpoint of the serial data flow graph, wherein the quiesce manager is connected to the quiesce node, to the serialize node and/or to the serialize end node;
    activating the serialize node to start a serial operation; and
    activating the serialize end node after the serial operation has been terminated.

16. A computer program product for implementing a serialization construct within an environment of a number of parallel data flow graphs, the computer program product comprising:
    a non-transitory computer readable storage medium readable by a processor and storing instructions for execution by the processor for performing a method comprising:
        appending, by a quiesce manager, a quiesce node to an active data flow graph, wherein the quiesce node prevents a token from passing to a next data flow graph within a chain before an execution of the active data flow graph has been finished;
        implementing a serial data flow graph provided for a serial execution while no other data flow graph is active;
        appending a serialize node to a starting point of the serial data flow graph;

appending a serialize end node to an endpoint of the serial data flow graph, wherein the quiesce manager is connected to the quiesce node, to the serialize node and/or to the serialize end node;

activating the serialize node to start a serial operation; and activating the serialize end node after the serial operation has been terminated.

17. The computer program product of claim 16, wherein the serial operation comprises a sequence of operations.

* * * * *